United States Patent
Chen et al.

(10) Patent No.: US 11,275,317 B1
(45) Date of Patent: Mar. 15, 2022

(54) DROPLET GENERATOR AND METHOD OF SERVICING A PHOTOLITHOGRAPHIC TOOL

(71) Applicant: TAIWAN SEMICONDUCTOR MANUFACTURING CO., LTD., Hsinchu (TW)

(72) Inventors: Yu-Huan Chen, Hsinchu (TW); Cheng-Hsuan Wu, New Taipei (TW); Ming-Hsun Tsai, Hsinchu (TW); Shang-Chieh Chien, New Taipei (TW); Li-Jui Chen, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 17/187,272

(22) Filed: Feb. 26, 2021

(51) Int. Cl.
 *G03F 7/20* (2006.01)
 *H05G 2/00* (2006.01)

(52) U.S. Cl.
 CPC ......... *G03F 7/70858* (2013.01); *H05G 2/005* (2013.01); *H05G 2/006* (2013.01); *H05G 2/008* (2013.01)

(58) Field of Classification Search
 CPC .......... G03F 7/70033; G03F 7/70858; G03F 7/70883; G03F 7/70891; G03F 7/70908; H05G 2/00–008
 USPC .............................................. 355/30, 67, 77
 See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 2010/0213272 A1* | 8/2010 | Yabu ....................... | H05G 2/005 239/102.1 |
| 2014/0261761 A1* | 9/2014 | Vaschenko ............. | H05G 2/006 137/334 |
| 2018/0160519 A1* | 6/2018 | Iwamoto .................. | H05G 2/00 |
| 2020/0107427 A1* | 4/2020 | Tu .......................... | H05G 2/006 |
| 2021/0033986 A1* | 2/2021 | Tu ....................... | G03F 7/70875 |
| 2021/0059036 A1* | 2/2021 | Tu .......................... | H05G 2/008 |
| 2021/0072646 A1* | 3/2021 | Hayashi ................ | G03F 7/7055 |

* cited by examiner

*Primary Examiner* — Colin W Kreutzer
(74) *Attorney, Agent, or Firm* — McDermott Will & Emery LLP

(57) ABSTRACT

A photolithographic apparatus includes a droplet generator, a droplet generator maintenance system, and a controller communicating with the droplet generator maintenance system. The droplet generator maintenance system operatively communicates with the droplet generator, a coolant distribution unit, a gas supply unit, and a supporting member. The gas supply unit includes a heat exchange assembly and an air heating assembly. The coolant distribution unit is configured to control the temperature of the droplet generator within the acceptable droplet generator range.

20 Claims, 15 Drawing Sheets

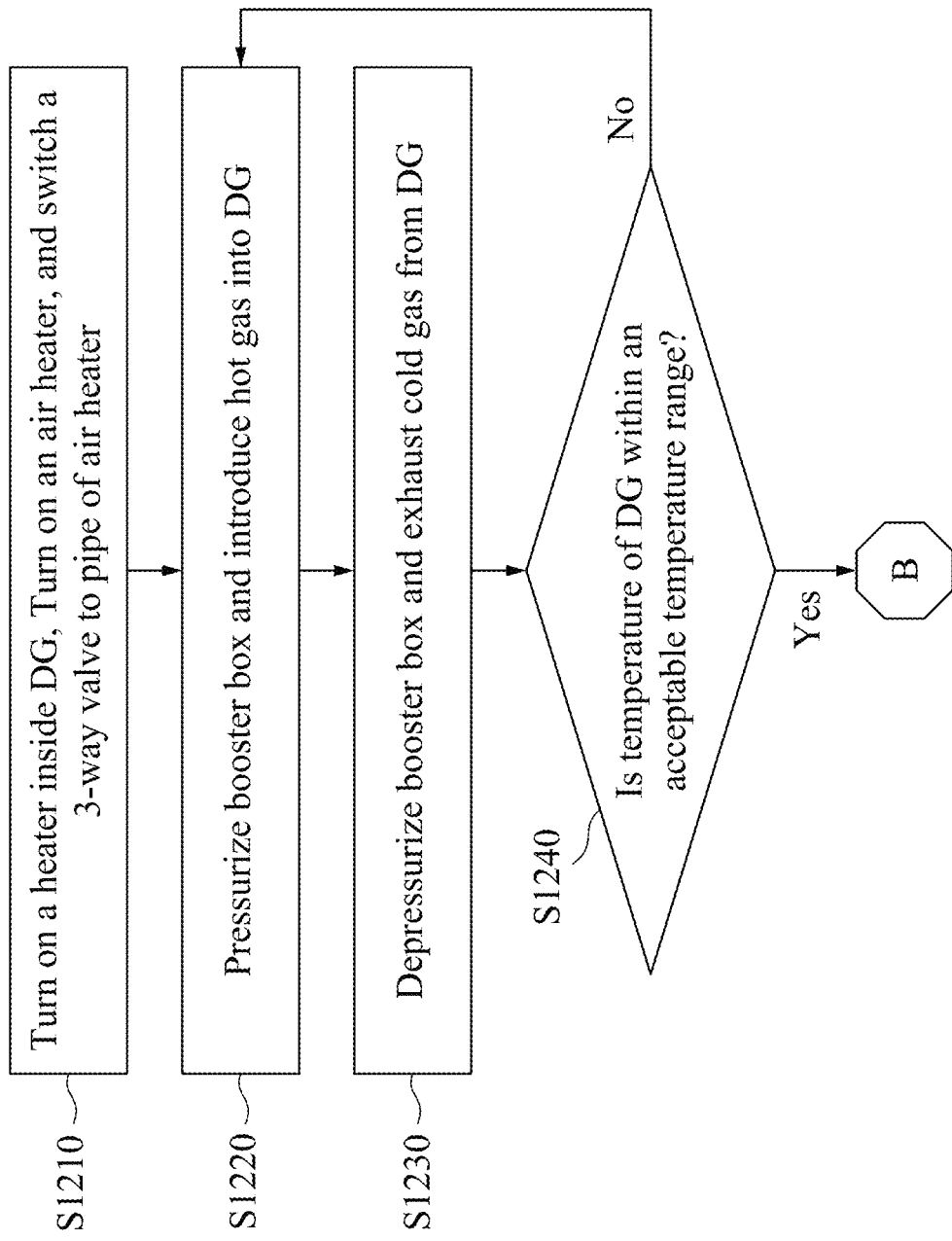

DROPLET GENERATOR AND METHOD OF SERVICING A PHOTOLITHOGRAPHIC TOOL

TECHNICAL FIELD

The disclosure relates to a droplet generator for an extreme ultraviolet imaging tool and a method of servicing the extreme ultraviolet imaging tool.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size. The decrease in size of devices has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 9 illustrates a flow chart of a method for controlling the droplet generator maintenance system to perform a droplet generator heating process in accordance with an embodiment of the present disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography systems and methods. More particularly, it is related to extreme ultraviolet lithography (EUVL) tools and methods of servicing the tools. In an EUVL tool, a laser-produced plasma (LPP) generates extreme ultraviolet radiation which is used to image a photoresist coated substrate. In an EUV tool, an excitation laser heats metal (e.g., tin, lithium, etc.) target droplets in the LPP chamber to ionize the droplets to plasma which emits the EUV radiation. For reproducible generation of EUV radiation, the target droplets arriving at the focal point (also referred to herein as the "zone of excitation") have to be substantially the same size and arrive at the zone of excitation at the same time as an excitation pulse from the excitation laser arrives. Thus, stable generation of target droplets that travel from the target droplet generator to the zone of excitation at a uniform (or predictable) speed contributes to efficiency and stability of the LPP EUV radiation source.

Figure 1:
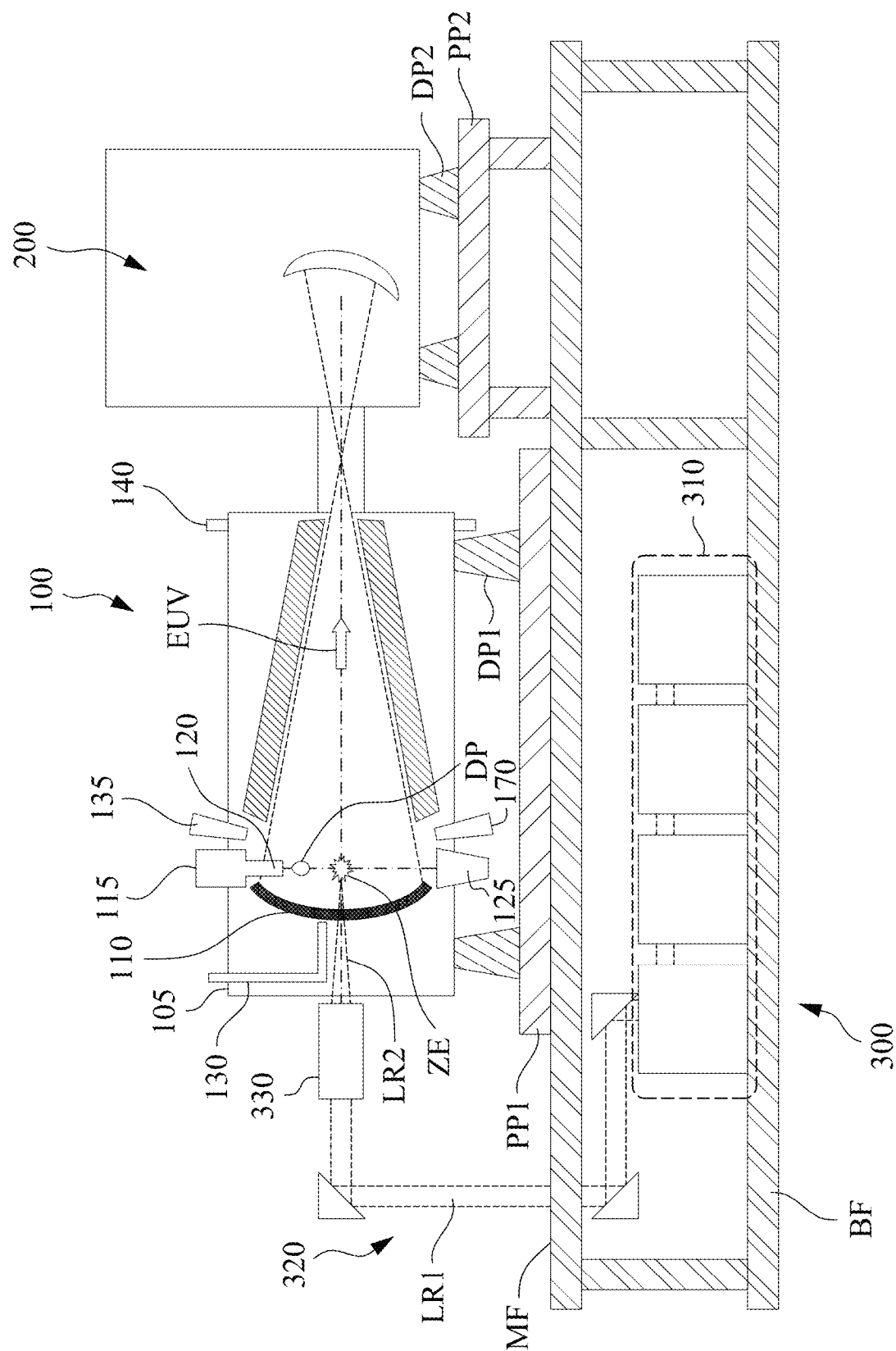
FIG. 1 shows an extreme ultraviolet lithography tool according to an embodiment of the disclosure.

FIG. 1 is a schematic view of an EUV lithography tool with a laser produced plasma (LPP) based EUV radiation source, constructed in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 2:
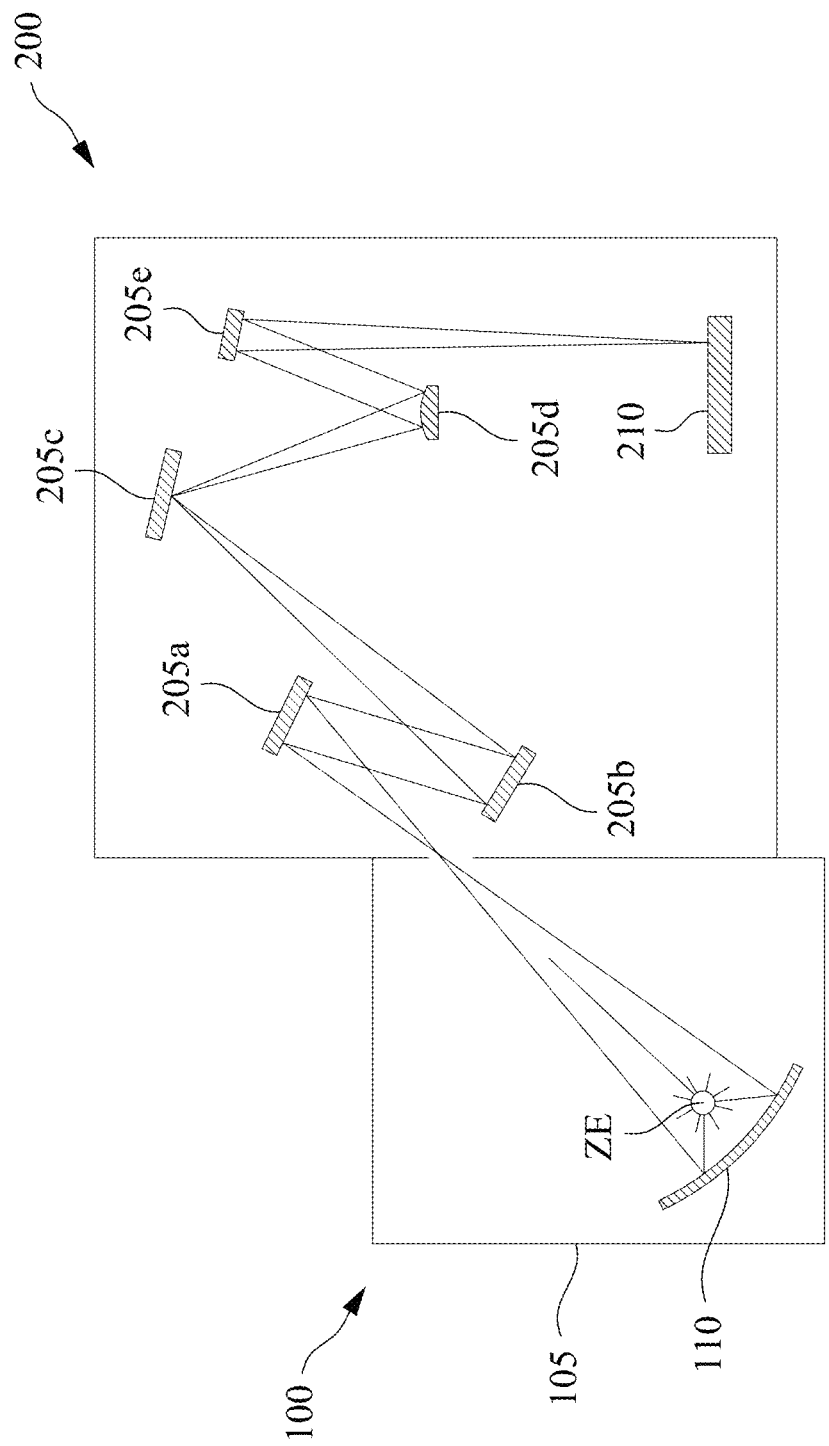
FIG. 2 shows a schematic diagram of a detail of an extreme ultraviolet lithography tool according to an embodiment of the disclosure.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including an EUV light radiator ZE emitting EUV light in a chamber 105 that is reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gradings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic", as used herein, are meant to be limited to components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the patterning optic 205c is a reflective mask. In an embodiment, the reflective mask 205c includes a substrate with a suitable material, such as a low thermal expansion material or fused quartz. In various examples, the material includes $TiO_2$ doped $SiO_2$, or other suitable materials with low thermal expansion. The reflective mask 205c includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configured to highly reflect the EUV light. The mask 205c may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

In various embodiments of the present disclosure, the photoresist coated substrate 210 is a semiconductor wafer, such as a silicon wafer or other type of wafer to be patterned.

The EUVL tool further include other modules or is integrated with (or coupled with) other modules in some embodiments.

As shown in FIG. 1, the EUV radiation source 100 includes a target droplet generator 115 and a LPP collector 110, enclosed by a chamber 105. In various embodiments, the target droplet generator 115 includes a reservoir (see FIG. 3) to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz). In some embodiments, the target droplets DP are supplied at an ejection-frequency of about 100 Hz to a about 25 kHz. In other embodiments, the target droplets DP are supplied at an ejection frequency of about 500 Hz to about 10 kHz. The target droplets DP are ejected through the nozzle 127 and into a zone of excitation ZE at a speed in a range of about 10 meters per second (m/s) to about 100 m/s in some embodiments. In some embodiments, the target droplets DP have a speed of about 10 m/s to about 75 m/s. In other embodiments, the target droplets have a speed of about 25 m/s to about 50 m/s.

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 µm or 10.6 µm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such an embodiment, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure device 200.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, $N_2$ or another inert gas. In certain embodiments, $H_2$ used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140.

Figure 3A:
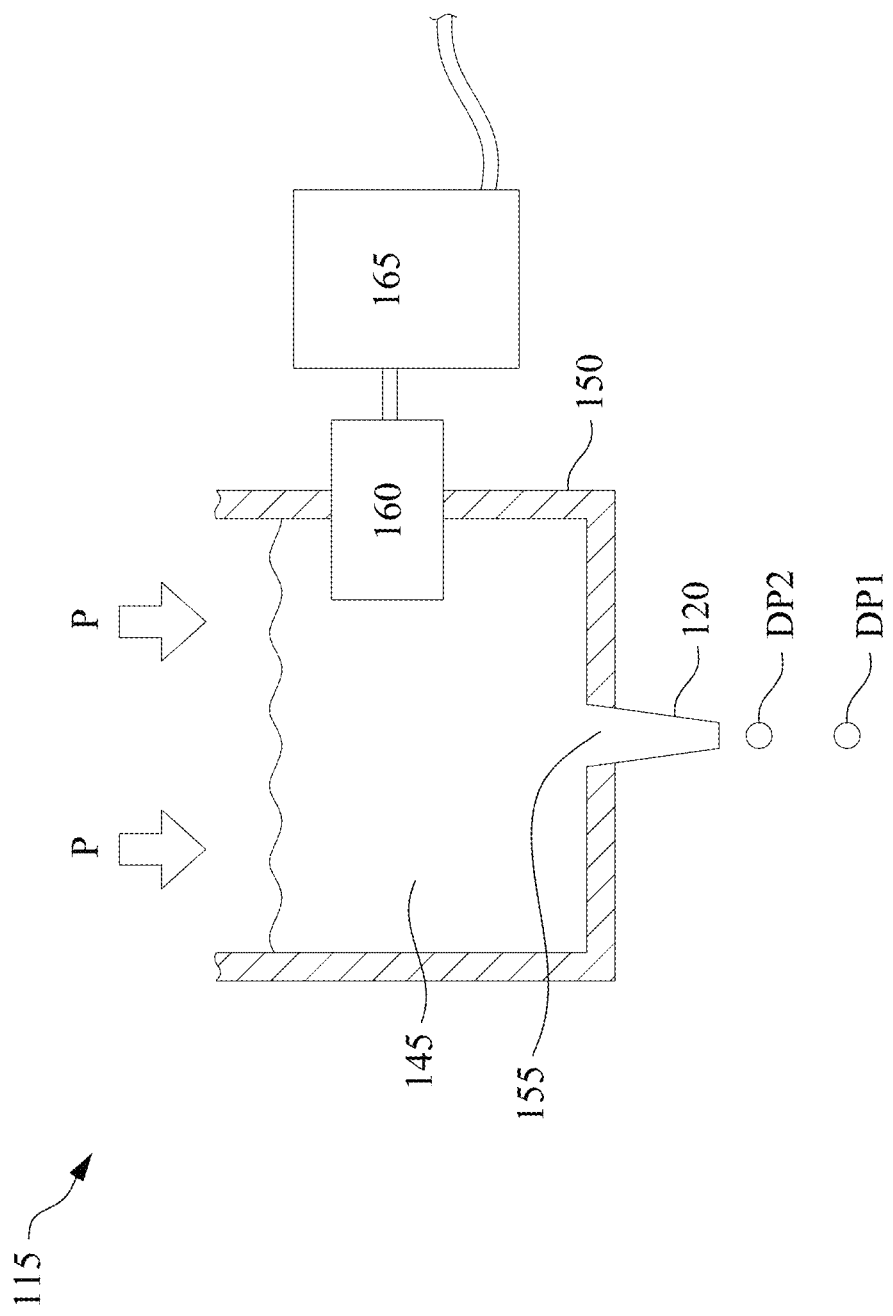
FIGS. 3A and 3B show a schematic diagram of a droplet generator according to an embodiment of the disclosure.

FIG. 3A schematically illustrates the components of the droplet generator 115. As shown in FIG. 3A, the droplet generator 115 includes a reservoir 150 holding a fluid 145, e.g. molten tin, under pressure P. The reservoir 150 is formed with an orifice 155 allowing the pressurized fluid 145 to flow through the orifice 155 establishing a continuous stream which subsequently breaks into a plurality of droplets DP1, DP2 exiting the nozzle 120.

The target droplet generator 115 shown further includes a sub-system producing a disturbance in the fluid 145 having an electro-actuatable element 160 that is operably coupled with the fluid 145 and a signal generator 165 driving the electro-actuatable element 145 in some embodiments. In some embodiments, the electro-actuatable element 145 is a piezoelectric actuator that applies vibration to the fluid. In some embodiments, the electro-actuatable element 145 is an ultrasonic transducer or a megasonic transducer.

When the reservoir 150 becomes empty or the remaining fluid is less than a threshold level, a maintenance operation is performed. During maintenance or servicing, the nozzle 120 is cooled down. If the nozzle cools down, it will have to be brought back up to operating temperature prior to restarting the droplet generator 115. This can increase downtime during maintenance or servicing. Further, a change in temperature of the nozzle 120 changes the droplet quality. The droplet generator may need to be recalibrated after it cools down, which further increase tool downtime during maintenance and servicing.

Figure 3B:
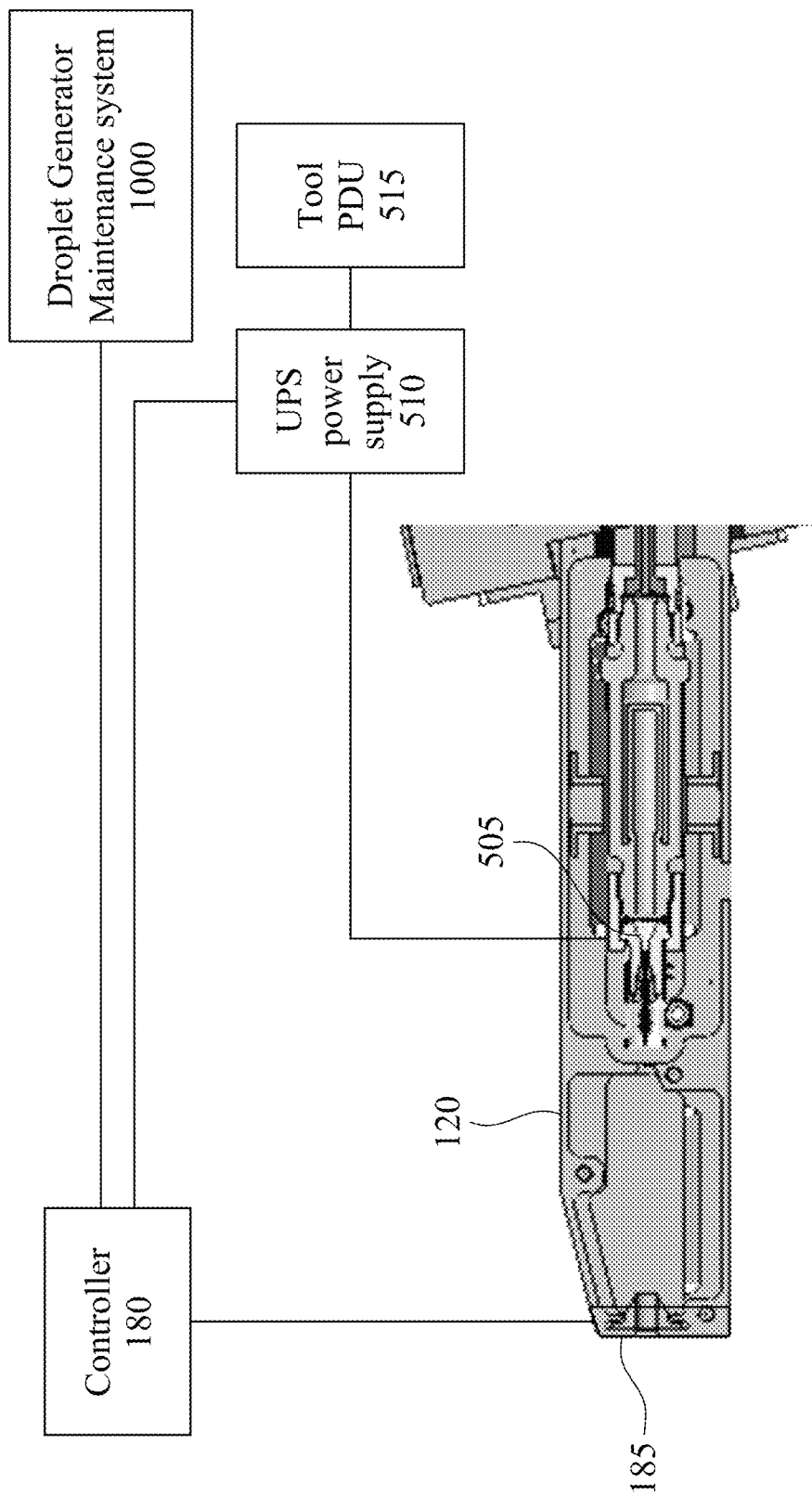

As shown in FIG. 3B, a heating element 505 is connected to the nozzle 120 to maintain the nozzle at the operating temperature during maintenance and servicing. In some embodiments, the temperature of the nozzle is maintained at about 250° C. during maintenance and servicing. The heating element 505 is connected to an uninterruptible power supply (UPS) 510 to continuously provide power to the heating element 505 during maintenance or servicing. In some embodiments, the uninterruptible power supply 510 is connected to a power distribution unit (PDU) 515 of the EUVL tool. In some embodiments, the uninterruptible power supply 510 is connected to the controller 180. In some embodiments, the controller 180 closes the isolation valve 185 and activates the uninterruptible power supply 510 substantially simultaneously. In some embodiments, the controller 180 also opens a valve from the inert gas source (not shown) to cause inert gas to flow into the nozzle 120 through an inlet. In some embodiments, the controller 180 closes the isolation valve 185, initiates inert gas flow to the nozzle 120, and activates the uninterruptible power supply 510 to power the heating element 505 substantially simultaneously. In some embodiments, the controller 180 communicates with a droplet generator maintenance (DGM) system 1000.

Figure 4A:
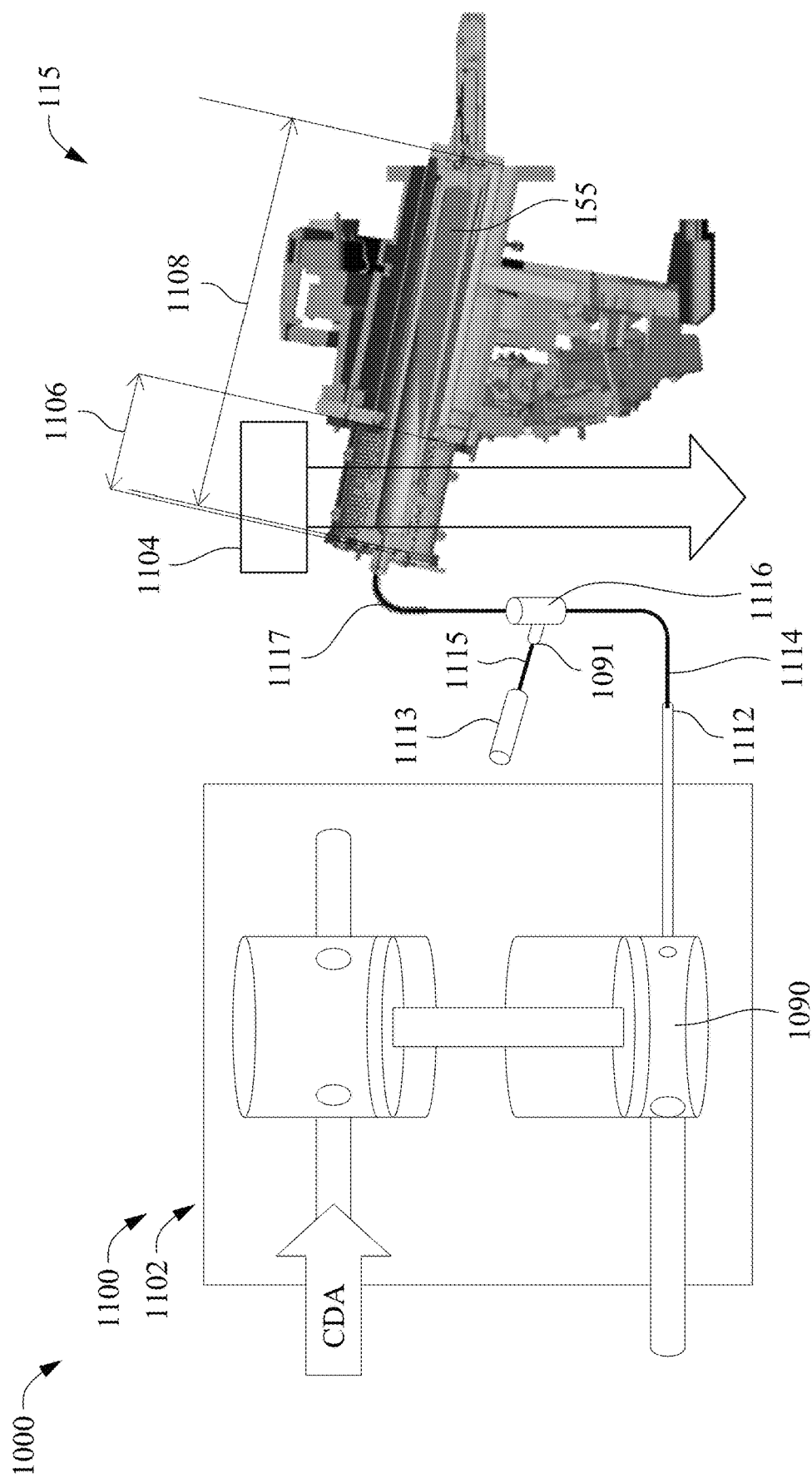
FIG. 4A shows a detailed view of a coolant distribution unit and an air-cooled droplet generator according to an embodiment of the disclosure.

FIG. 4A shows the droplet generator maintenance (DGM) system 1000 including a coolant distribution unit 1100 and an air-cooled droplet generator. The coolant distribution unit 1100 includes a booster box 1102 and a pressurized gas 1090. In some embodiments, the gas is $N_2$, Ar, He, $H_2$ or mixture thereof. In some embodiments, the gas is a forming gas (i.e. a mixture of $H_2$ and $N_2$). In some embodiments, the forming gas contains from about 5 mol % $H_2$ to about 15 mol % $H_2$ in $N_2$. The coolant distribution unit 1100 is connected to the droplet generator 115 using a supply manifold 1112, a return manifold 1113, a supply line 1114, a return line 1115, a three-way valve 1116 and a droplet line 1117 in some embodiments. According to an embodiment of this disclosure, the droplet generator 115 is connected to the booster box 1102 via the supply manifold 1112, the supply line 1114 and the droplet line 1117 to receive a pressurized gas 1090 from the booster box 1102 to the orifice 155 of the droplet generator 115. In some embodiments, the droplet generator 1115 is also connected to the return manifold 1113 via the droplet line 1117 and the return line 1115 to exhaust hot pressurized gas 1091 from the orifice 155 of the droplet generator 115. In some embodiments, the three-way valve 1116 functions as a bridge between the supply line 1114 and the return line 1115 from the droplet line 1117. A plurality of quick connect couplings may be used as an interface among the supply line 1114, the return line 1115, the three-way valve 1116 and the droplet line 1117. By way of example, the plurality of quick connect couplings include various types of commercially available couplings.

In some embodiments, the droplet generator 115 includes an air conditioning device 1104 (e.g., external fans or blowers) to provide a forced air flow from top to bottom to cool the temperature of the droplet generator 115. In such an embodiment, the forced air flow by the air conditioning device 1104 passes through an air flow contact area 1106 of the droplet generator 115. Such forced air flow may pass through about 30% of a total surface area 1108 of the droplet generator 115. In addition, the forced air flow by the air conditioning device 1104 also includes exhausted hot air from a hot surface of the droplet generator 115. Faster recirculating of the air flow for the droplet generators within the LPP is often very complex in nature. Due to an air distribution by the air conditioning device 1104 within the current EUV scanner and increasing air flow requirements for the droplet generators, the temperature of the droplet generator 115 can get significantly higher than desired.

Clean dry air (CDA) is supplied to the booster box 1102 of the coolant distribution unit 1100. In some embodiments, CDA includes $N_2$ gas. In some embodiments, the CDA is introduced when it is necessary to provide pressure to the droplet generator. In some embodiments, the CDA is introduced at a pressure between a first pressure (filling pressure to the droplet generator) and a second pressure (exhaust pressure from the droplet generator). In some embodiments, the first pressure (filling pressure to the droplet generator) for the pressurizing operation is in a range from about 700 Pa to about 900 Pa. In some embodiments, the first pressure is about 800 Pa. In some embodiments, the second pressure (exhaust pressure) for the flushing operation is in a range from about 300 Pa to about 500 Pa. In some embodiments, the second pressure is about 400 Pa. In some embodiments, the second pressure for the flushing operation is in a range from about 40% to about 60% of the first pressure. In some embodiments, the second pressure is in a range from about 30% to about 70% of the first pressure.

Figure 4B:
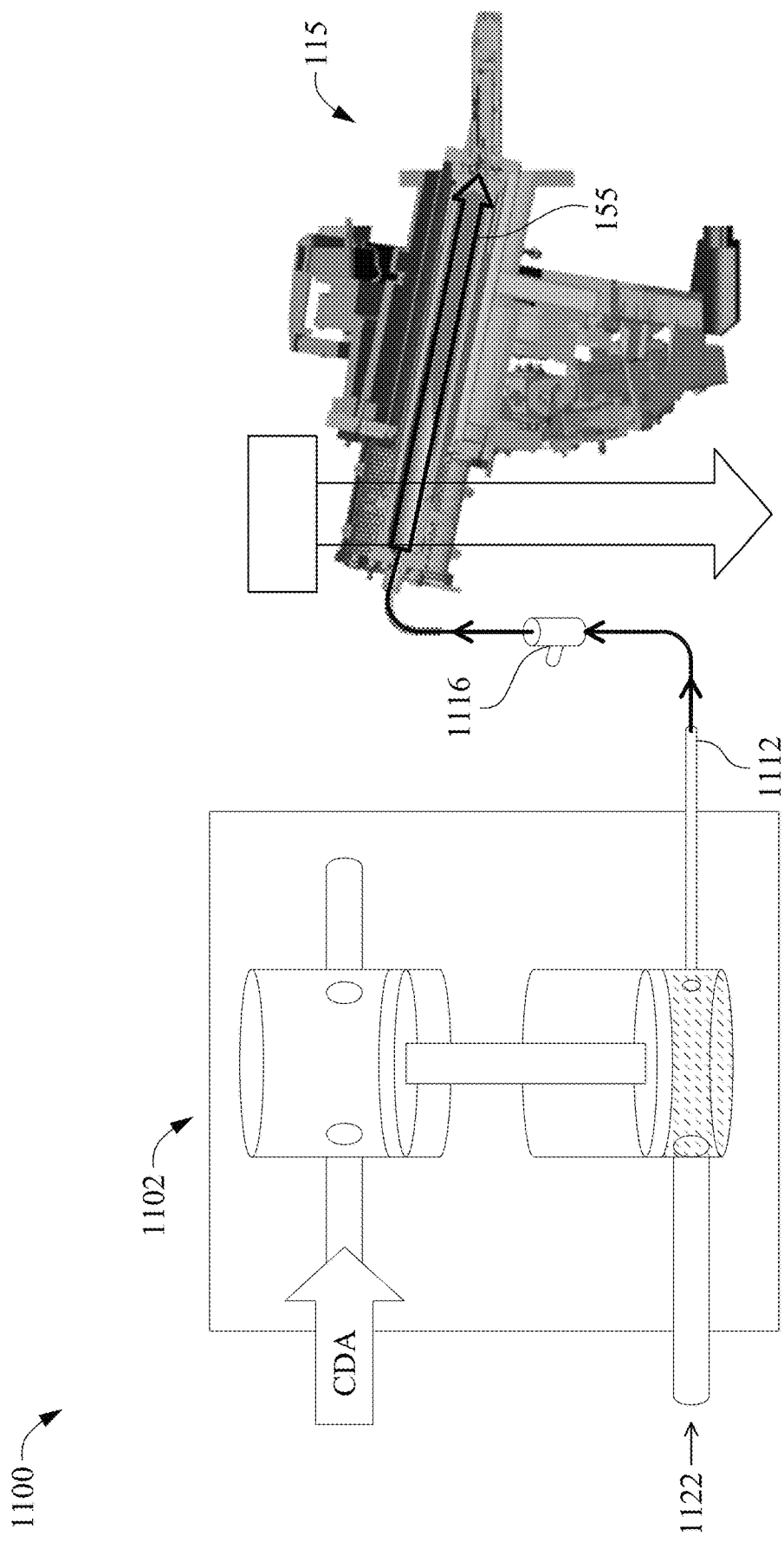
FIGS. 4B and 4C show an embodiment of the coolant distribution unit and the air-cooled the droplet generator according to an embodiment of the disclosure.
Figure 4C:
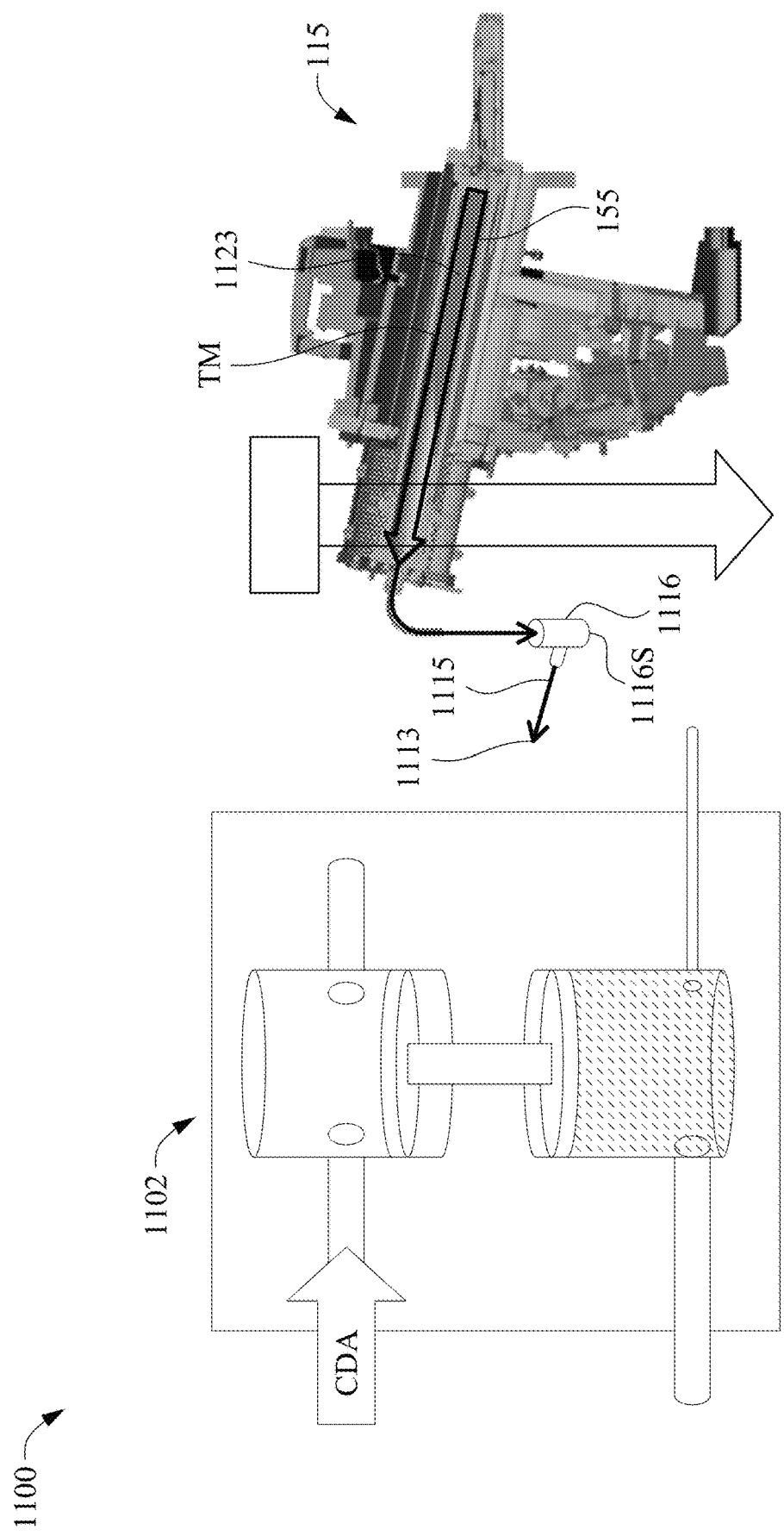

FIGS. 4B and 4C show an embodiment of the coolant distribution unit 1100 configured to control the temperature of the air-cooled droplet generator 115. As shown in FIG. 4B, the booster box 1102 is arranged to receive room temperature gas 1122. In some embodiments, the gas 1122 includes an ambient gas. When the gas 1122 is received into the booster box 1102, the coolant distribution unit 1100 is configured to pressurize the booster box 1102 using the clean dry air (CDA). In some embodiments, compressed CDA is provided to the booster box 1102 to allow a pneumatic connection between a CDA line and the supply manifold 1112 to change a configuration such that the gas 1122 in the supply manifold 1112 gets pressurized. The coolant distribution unit 1100 controls the three-way valve 1116 to provide the gas 1122 in the booster box 1102 through the supply manifold 1112 and the three-way valve 1116 and to introduce the gas 1122 into the orifice 155 of the droplet generator 115. When the ambient gas 1122 is received inside the orifice 155 of the droplet generator 115, the gas 1122 reduces the temperature of the orifice 155 by absorbing heat within the orifice 155 of the droplet generator 115 and becomes hot gas 1123.

FIG. 4C shows the coolant distribution unit 1100 that dissipates heat from the orifice 155 of the droplet generator 115. The coolant distribution unit 1100 of this embodiment is configured to close a supply end 1116S of the three-way valve 1116, and the booster box 1102 is depressurized. When the supply end 1116S of the three-way valve 1116 is closed from the booster box 1102, the coolant distribution unit 1100 is configured to open the return manifold 1113 and the return line 1115 so that heat accumulated inside the droplet generator 115 can be dissipated by the hot gas 1123.

When the hot gas 1123 is exhausted from the orifice 155 of the droplet generator 115, the temperature of the droplet generator is measured to determine whether the droplet generator DG is within an acceptable cold temperature range. If the measured temperature of the droplet generator DG is not within the acceptable temperature range, configurable parameters of the coolant distribution unit 1100 connected are automatically adjusted to repeat the process shown in FIGS. 4B and 4C, so as to reduce the temperature of the droplet generator DG within the acceptable temperature range. In some embodiments, the acceptable cold temperature range of the DG ranges is from about 5° C. to about 50° C.

Figure 5:
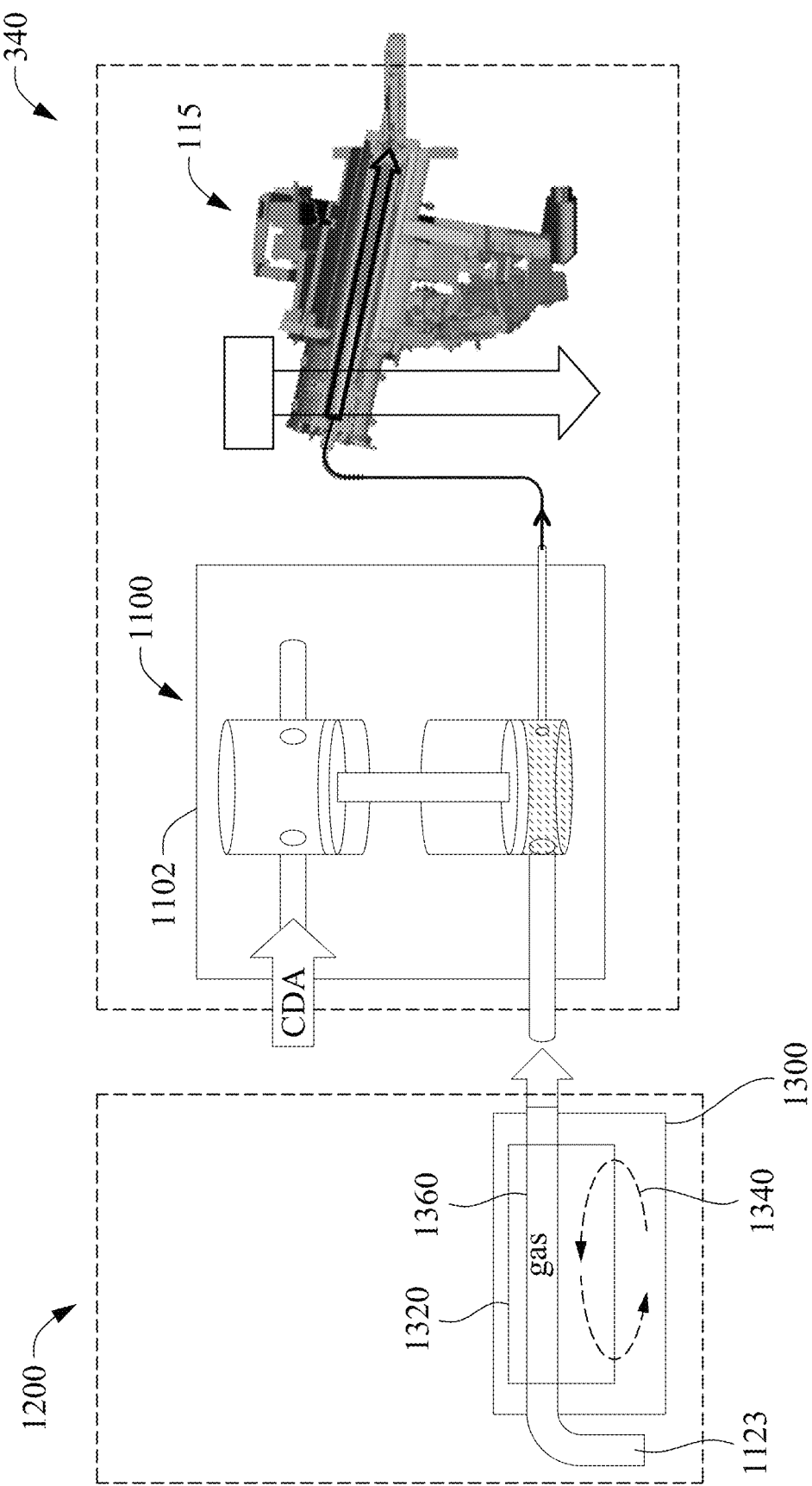
FIG. 5 shows a detailed view of a droplet generator maintenance system including a dual gas supply unit according to an embodiment of the disclosure.

As shown in FIG. 5, the droplet generator maintenance system 1000 further includes a gas supply unit 1200. In some embodiments, the gas supply unit 1200 includes a heat exchange assembly 1300. The heat exchange assembly 1300 is configured to extract heat from hot gas purged from the droplet generator DG to decrease the temperature of the gas prior to entering the booster box 1102 of the coolant distribution unit 1100. The heat exchange assembly 1300 includes a heat exchanger 1320, a facility coolant loop 1340 and a system coolant gas line 1360. When the heat exchange assembly 1300 is operatively communicating with the LPP, the facility coolant loop 1340 receives chilled facility coolant from a coolant source and passes at least a portion of the coolant through the heat exchanger 1320. The system coolant gas line 1360 receives a purged hot gas and provides a heat-exchanged cold gas in a temperature range from about −40° C. to about 0° C. to the booster box 1102 of the coolant distribution unit 1100. In such an embodiment, the droplet generator 115 is connected to the booster box 1102 via the supply manifold, the supply line and the droplet line and receives the heat-exchanged cold gas from the booster box into the orifice of the droplet generator to cool the temperature in the orifice of the droplet generator 115.

Figure 6A:
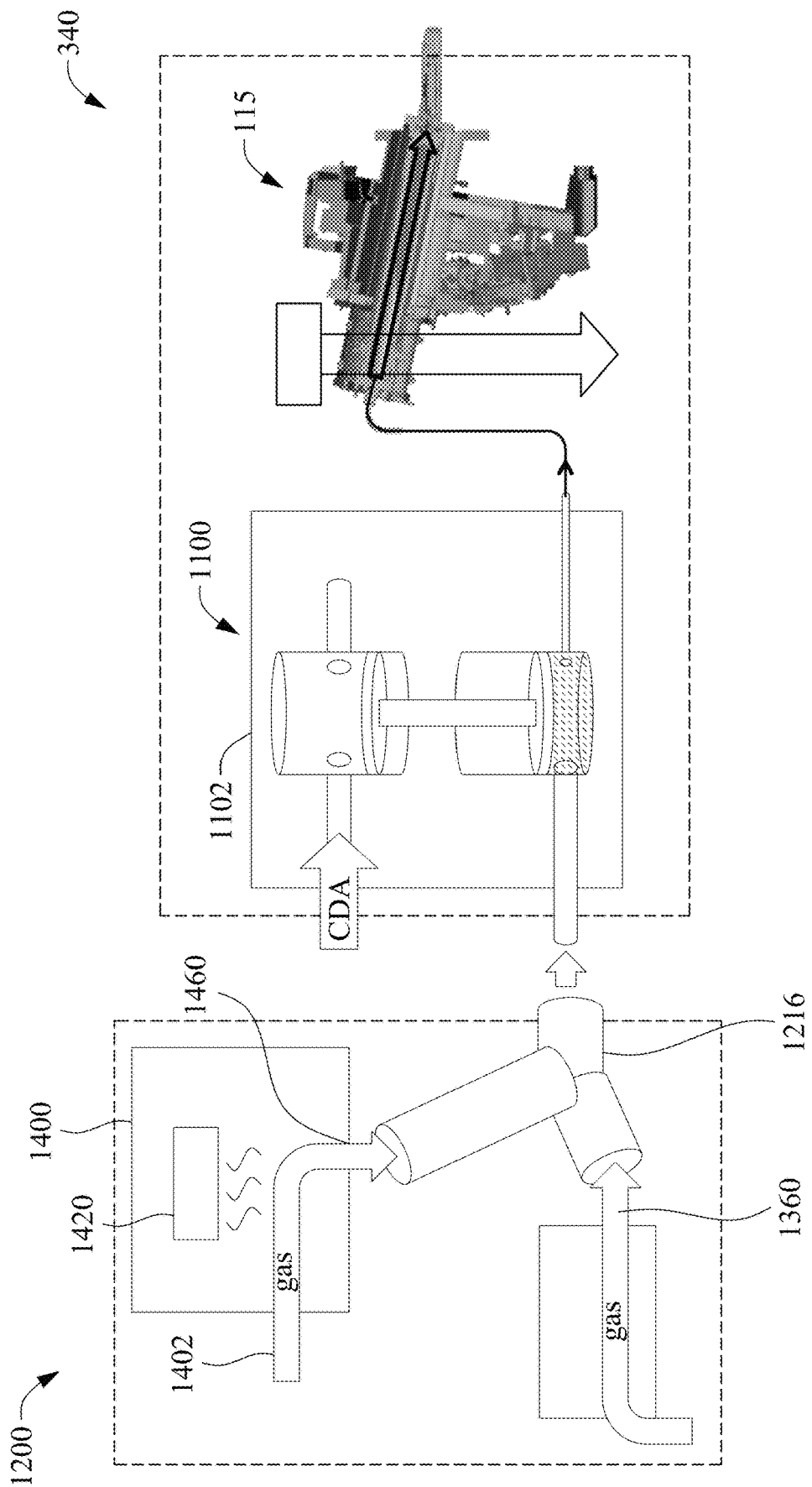
FIG. 6A schematically illustrates the operation of the dual gas supply unit according to an embodiment of the disclosure.

FIG. 6A schematically illustrates a variation in the gas supply unit 1200 used to heat the droplet generator DG. The gas supply unit 1200 further includes an air heating assembly 1400 as shown in FIG. 6A. In some embodiments, the air heating assembly 1400 includes an air heater 1420. The air heating assembly 1400 is configured to provide heat to cold gas 1402 and to increase the temperature of the gas prior to entering the booster box 1102 of the coolant distribution unit 1100. The air heating assembly 1400 includes the air heater 1420 and a system heated gas line 1460. When the air heating assembly 1400 is operatively communicating with the LPP, the air heating assembly 1400 receives the cold gas 1402 from a gas source and passes at least a portion of and through the air heater 1420. The system heated gas line 1460 receives a cold gas purged from the droplet generator DG and provides a hot gas to the booster box 1102 of the coolant distribution unit 1100 to heat the droplet generator DG to its operating temperature. In such an embodiment, the droplet generator 115 is connected to the booster box 1102 via the supply manifold, the supply line and the droplet line and receives the hot gas from the booster box into the orifice of the droplet generator to increase the temperature in the orifice of the droplet generator 115. In some embodiments, the hot gas provided to the droplet generator DG is heated to a temperature ranging from about 235° C. to about 300° C.

In some embodiments, the gas supply unit 1200 further includes a dual temperature three-way valve 1216 as a bridge between the system coolant gas line 1360 and the system heated gas line 1460 to the booster box 1102. A plurality of quick connect couplings may be used as an interface among the system coolant gas line 1360, system heated gas line 1460, the booster box 1102 and the dual temperature three-way valve 1216.

Figure 6B:
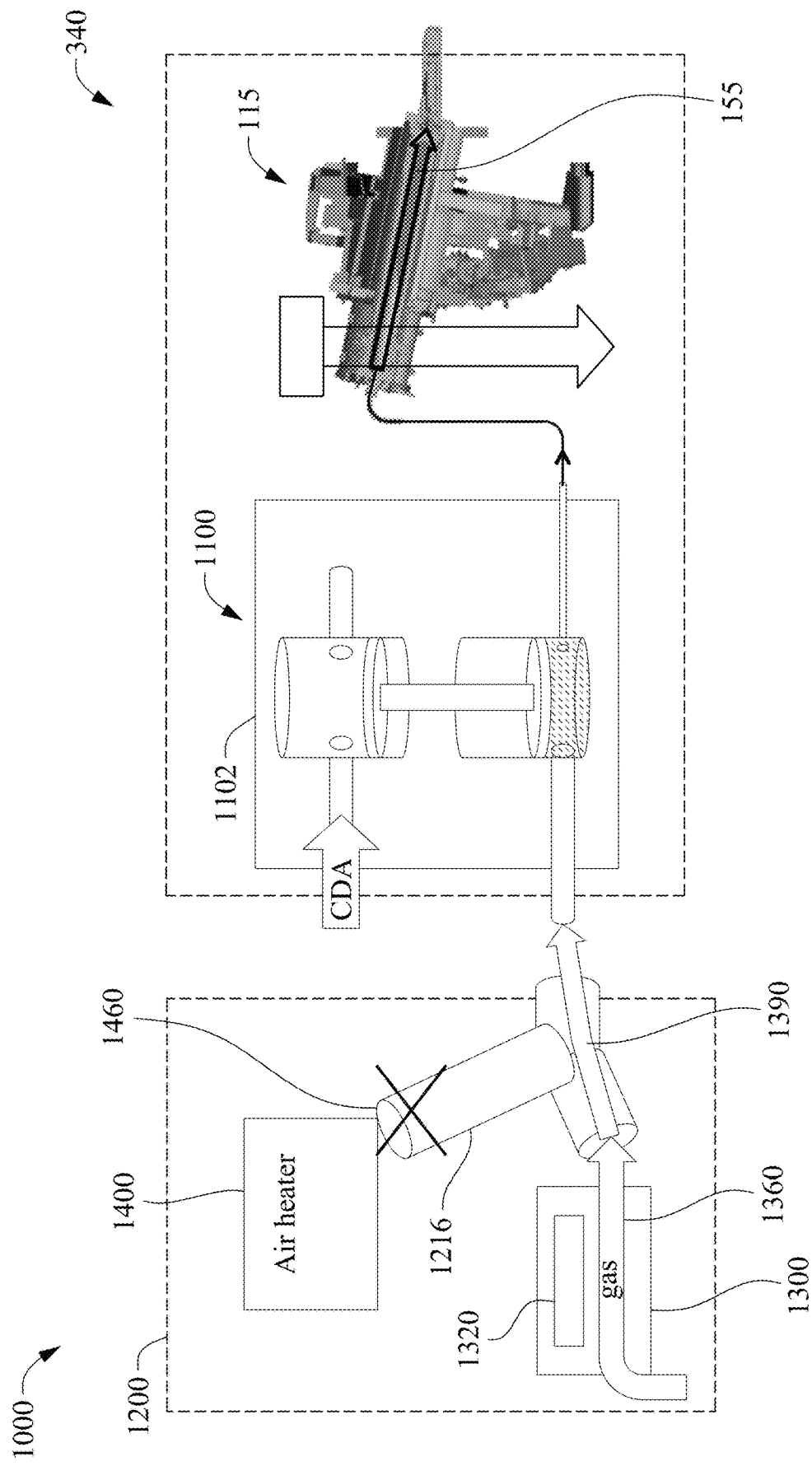
FIG. 6B schematically illustrates an operation of servicing an extreme ultraviolet lithography tool by using a heat exchange assembly.
Figure 6C:
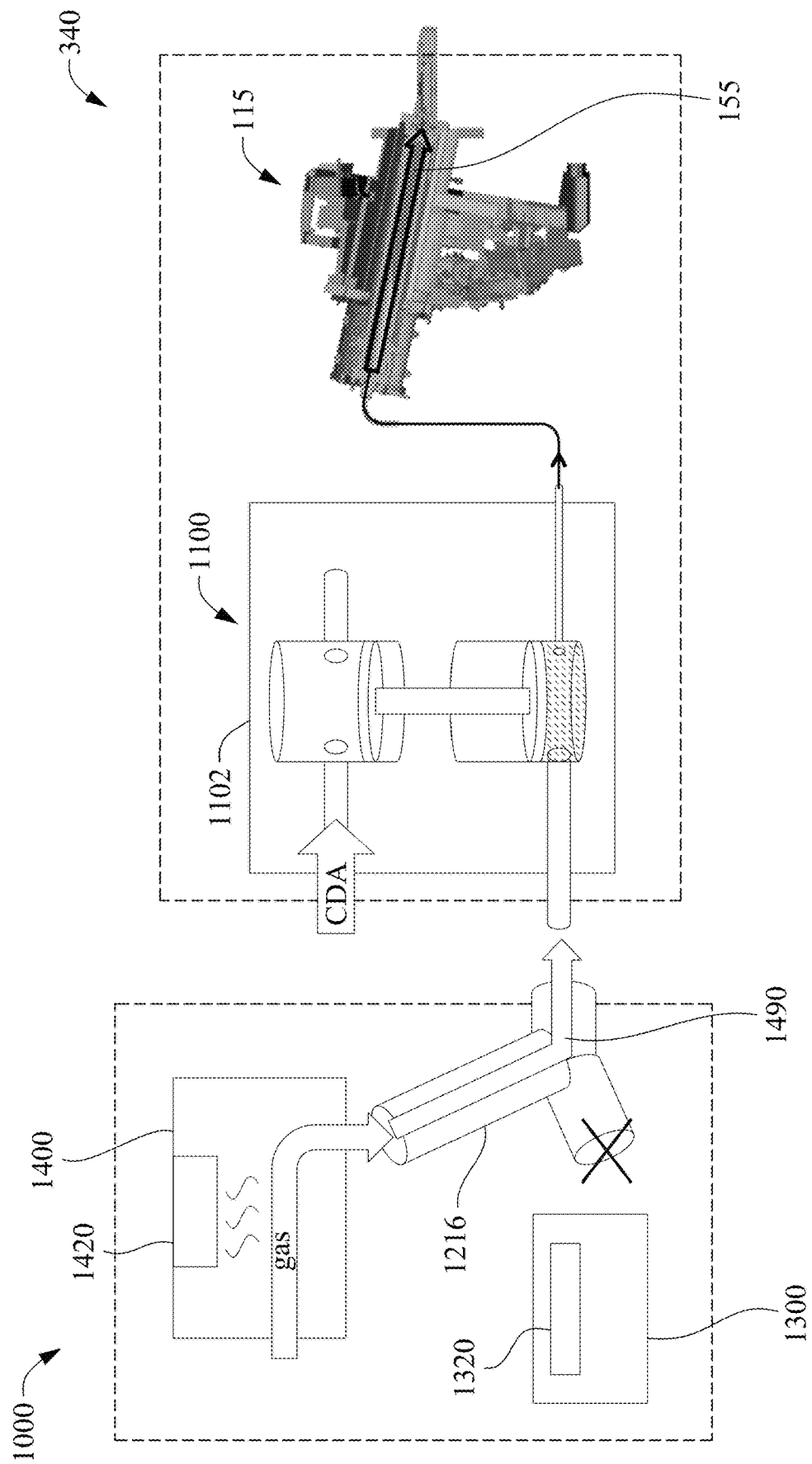
FIG. 6C schematically illustrates an operation of servicing an extreme ultraviolet lithography tool using an air heating assembly.
Figure 6D:
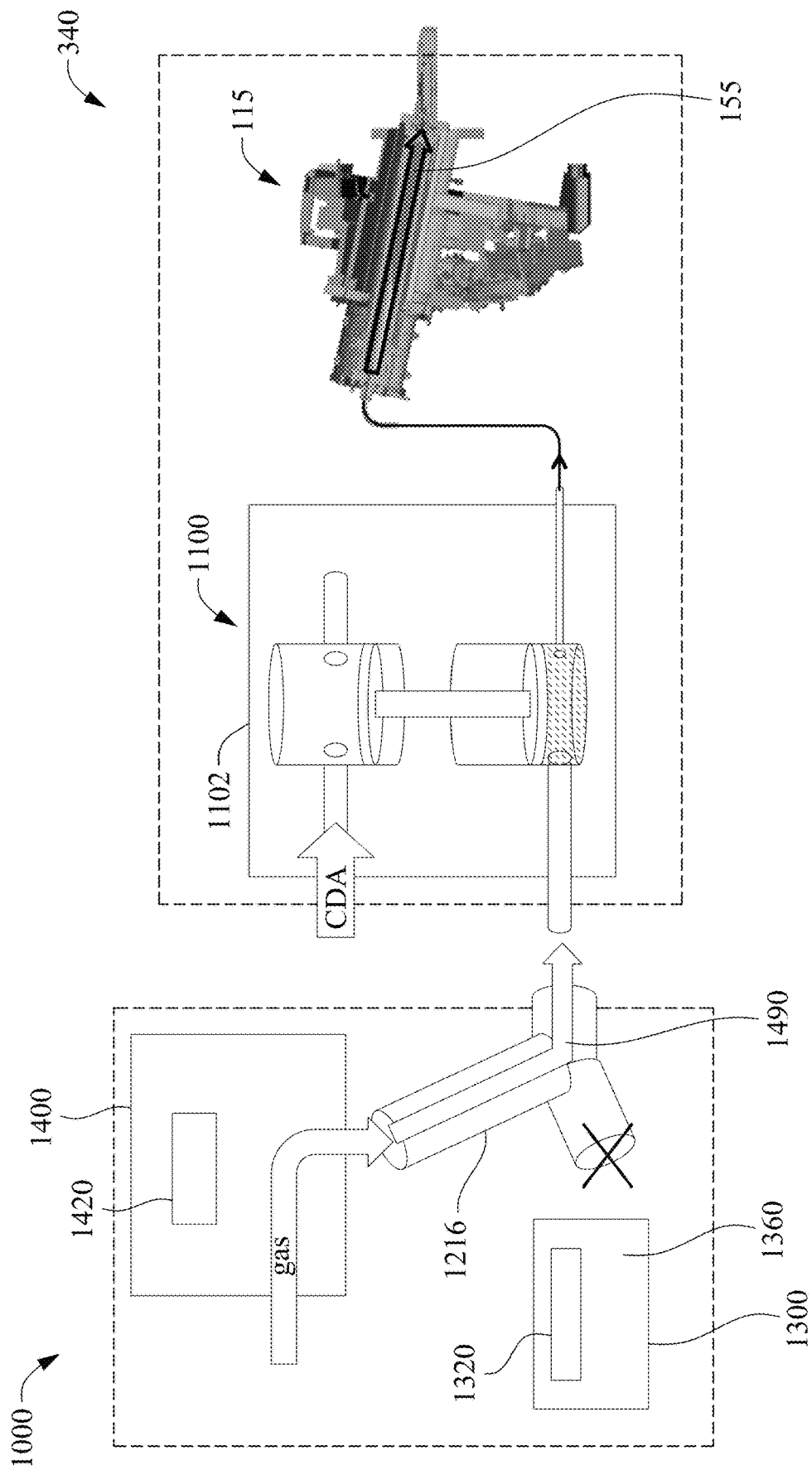
FIG. 6D schematically illustrates an operation of servicing an extreme ultraviolet lithography tool using a gas.

FIGS. 6B, 6C and 6D schematically illustrate an operation of servicing an extreme ultraviolet lithography tool. As shown in FIG. 6B, when the droplet generator maintenance starts, in some embodiments, the droplet generator maintenance (DGM) system 1000 turns on the heat exchanger 1320 of the heat exchange assembly 1300 and switches the dual temperature three-way valve 1216 to the system coolant gas line 1360 so that the heat exchange assembly 1300 is connected to the booster box 1102. Then, the DGM system 1000 controls the booster box 1102, so that cold gas 1390 is introduced into the droplet generator 115 to cool the temperature in the orifice of the droplet generator 115. In such an embodiment, the DGM system 1000 closes the system heated gas line 1460 to isolate the air heating assembly 1400 from the dual temperature three-way valve 1216 of the gas supply unit 1200.

As shown in FIG. 6C, when the droplet generator 115 needs to be heated up, the DGM system 1000 turns on the air heater 1420 of the air heating assembly 1400 and switches the dual temperature three-way valve 1216 from the system coolant gas line 1360 so that the heat exchange assembly 1300 is not connected to the booster box 1102. Then, the DGM system 1000 controls the booster box 1102, so that hot gas 1490 can be introduced into the orifice 155 to increase the temperature in the orifice of the droplet generator 115. In such an embodiment, the DGM system 1000 closes the system coolant gas line 1360 to isolate the heat exchange assembly 1300 from the dual temperature three-way valve 1216 of the gas supply unit 1200.

As shown in FIG. 6D, when the droplet generator 115 is refilled with tin (Sn) and is about to pressurized the refilled tin, the DGM system 1000 turns on the air heater 1420, so that the DGM system 1000 allows the hot gas 1490 to be introduced into the orifice 155 of the droplet generator 115. The DGM system 1000 closes the system coolant gas line 1360 to isolate the heat exchange assembly 1300 from the dual temperature three-way valve 1216 of the gas supply unit 1200.

Figure 7:
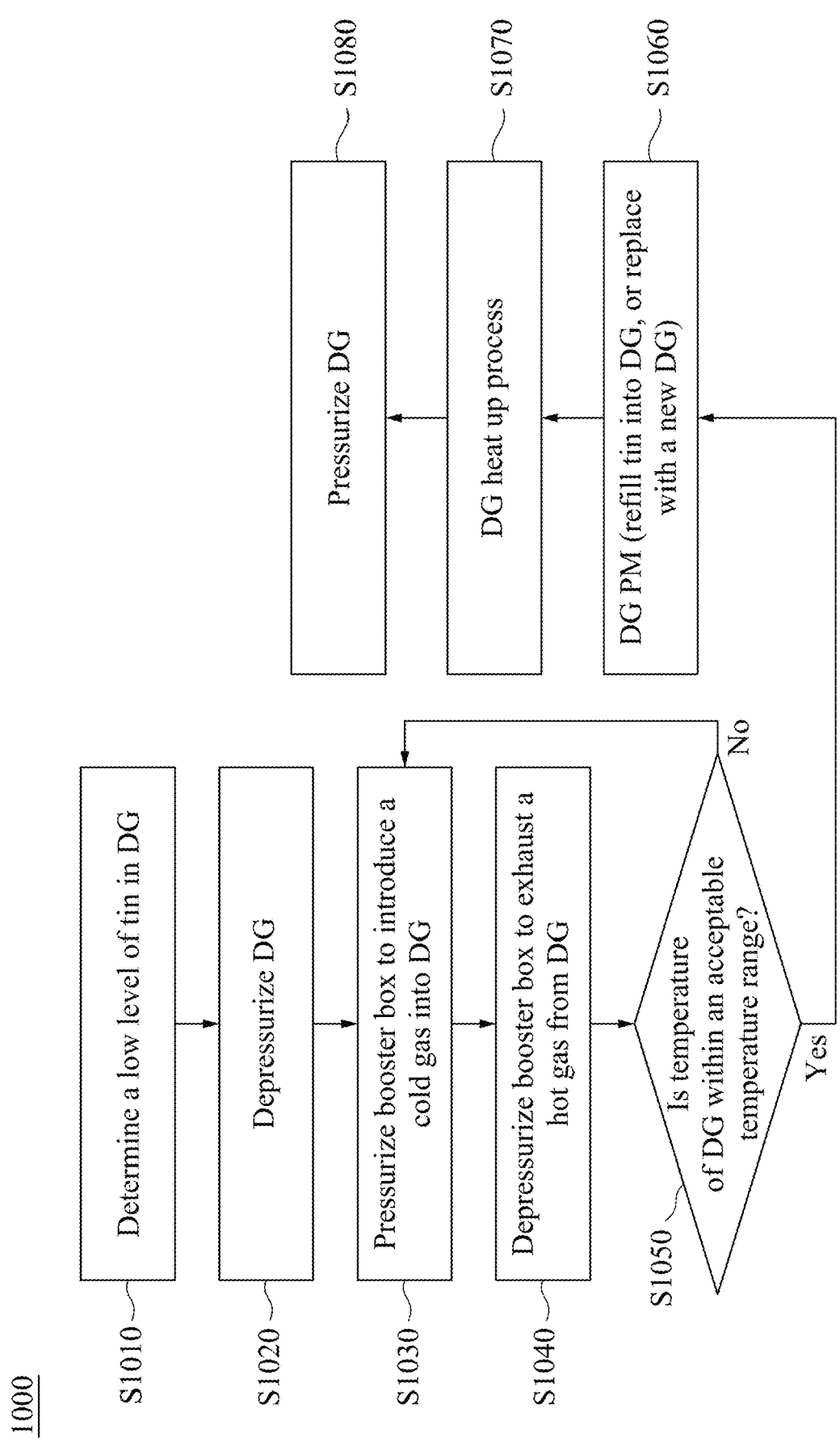
FIG. 7 is a flowchart of a method of servicing an extreme ultraviolet lithography tool according to an embodiment of the disclosure.

FIG. 7 illustrates a flow chart of a method 1000 for controlling the droplet generator maintenance (DGM) system 1000 in accordance with an embodiment of the present disclosure. Tin is supplied to the reservoir 150 shown in FIG. 3 the by pressuring the droplet generator DG. Then, the EUV lithography process is performed.

The method includes, at S1010, determining whether tin stored in the droplet generator DG is below a threshold level. If a level sensor detects that the stored tin is below the threshold level, at S1020, the droplet generator DG is depressurized. When the droplet generator DG is depressurized, at S1030, the booster box is pressurized to introduce cold gas into the droplet generator DG. In some embodiments, the cold gas is a forming gas. In some embodiments, the temperature of the cold gas ranges from about −40° C. to about 0° C. The cold gas is at a lower temperature than the droplet generator. When the cold gas is filled in the droplet generator DG, at S1040, the booster box is depressurized so that hot gas can be exhausted from the droplet generator DG.

At S1050, the temperature is measured to determine whether a temperature of the droplet generator DG is within an acceptable temperature range (i.e. between about 5° C. and about 50° C.). In some embodiments, the acceptable temperature range is between In some embodiments, the temperature measured by a temperature sensor of the droplet generator DG indicates a performance of the gas supply unit 1200. In some embodiments, the temperature sensor includes a logic circuit that is programmed to generate a signal when a detected variation in temperature measurement is not within an acceptable range. For example, a signal is generated when the detected variation in temperature is less than a certain threshold value. The threshold value of variation in temperature measurement is, for example, an expected minimum variation in temperature measurement of the gas supply unit 1200. If the measured temperature of the droplet generator DG is not within the acceptable temperature range, configurable parameters of the DGM system 1000 are automatically adjusted to repeat the operations of S1030, S1040 and S1050, so as to reduce the temperature of the droplet generator DG to within the acceptable temperature range.

When the temperature of the droplet generator DG is within the acceptable temperature range, the droplet generator maintenance (DGM) is performed at S1060 by refilling tin into the droplet generator DG or replacing the droplet generator with a new droplet generator DG. When the droplet generator maintenance (DGM) is completed, at S1070, the DGM system 1000 performs a droplet generator heating process, method 1200, as shown in FIG. 9 to brng the droplet generator DG up to its operating temperature. When the droplet generator heating process is completed, the droplet generator DG is pressurized at S1080.

Figure 8:
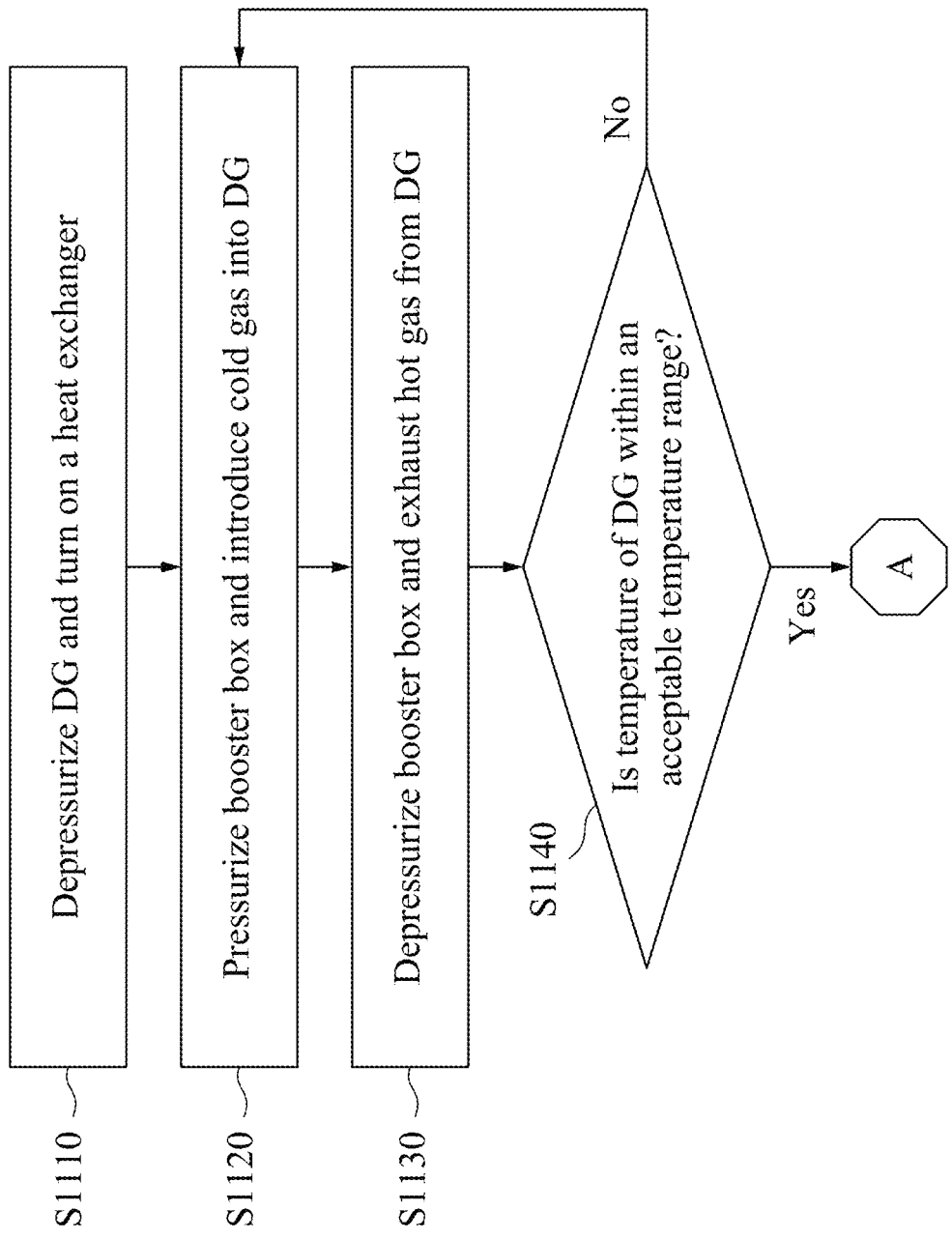
FIG. 8 illustrates a flow chart of a method for controlling a droplet generator maintenance system to perform a droplet generator cooling process in accordance with an embodiment of the present disclosure.

FIG. 8 illustrates a flow chart of a method 1100 for controlling the droplet generator maintenance system to perform the droplet generator cooling process in accordance with an embodiment of the present disclosure. The method includes, at S1110, depressurizing the droplet generator DG and turning on a heat exchanger 1320 of a heat exchange assembly 1300. Then, at S1120, the booster box is pressurized to introduce cold gas into the droplet generator DG. When the cold gas is filled in the droplet generator DG, at S1130, the booster box is depressurized so that hot gas can be exhausted from the droplet generator DG. At S1140, the temperature is measured to determine whether a temperature of the droplet generator DG is within an acceptable temperature range (i.e. from about 5° C. to about 50° C.). If the measured temperature of the droplet generator DG is not within the acceptable temperature range, configurable parameters of the DGM system 1000 are automatically adjusted to repeat the process of S1120, S1130 and S1140, so as to reduce the temperature of the droplet generator DG within the acceptable temperature range. When the temperature of the droplet generator DG is within the acceptable temperature range, the method continues a predetermined process A.

FIG. 9 illustrates a flow chart of a method 1200 for controlling the droplet generator maintenance system to perform the droplet generator heating process in accordance with an embodiment of the present disclosure. The method includes, at S1210, turning on the heating element 505 inside the droplet generator DG as shown in FIG. 3B, turning on a heat exchanger of a heat exchange assembly, and switching the dual temperature three-way valve 1216 to the system heated gas line 1460 so that the air heating assembly 1400 is connected to the booster box 1102. In some embodiments, the DGM system 1000 further controls the booster box 1102 so that the hot gas 1490 can be introduced into the orifice 155 to heat up the droplet generator 115. In some embodiments, the system coolant gas line 1360 is closed to isolate the heat exchange assembly 1300 from the dual temperature three-way valve 1216 of the gas supply unit 1200, at S1210.

Then, at S1220, the booster box is pressurized to introduce hot gas into the droplet generator DG. When the hot gas fills the droplet generator DG, at S1230, the booster box is depressurized so that cold gas can be exhausted from the droplet generator DG. At S1240, the temperature is measured to determine whether a temperature of the droplet generator DG is within an acceptable temperature range (i.e. from about 235° C. to about 300° C.). If the measured temperature of the droplet generator DG is not within the acceptable temperature range, configurable parameters of the DGM system 1000 are automatically adjusted to repeat the process of S1220, S1230 and S1240, so as to increase the temperature of the droplet generator DG within the acceptable temperature range. When the temperature of the droplet generator DG is within the acceptable temperature range, the method continues a predetermined process B.

Embodiments of the present disclosure provide the benefit of reducing downtime during maintenance and servicing of EUVL tools. Thus, the EUVL tool is more efficiently used.

An embodiment of the disclosure is a method of servicing a droplet generator for a photolithographic apparatus, in which the photolithographic apparatus comprises a droplet generator maintenance system operatively communicating with a droplet generator and having a coolant distribution unit, a gas supply unit and a supporting member. The coolant distribution unit provides a pressurized gas from a booster box of the coolant distribution unit to an orifice of the droplet generator. The gas supply unit includes a heat exchange assembly and an air heating assembly, and the supporting member that includes a three-way valve and a dual temperature three-way valve. The method includes determining whether tin stored in the droplet generator is below a threshold level. When the tin stored in the droplet generator is below the threshold level, the droplet generator is depressurized. Then, a booster box of the coolant distribution unit is pressurized to introduce a cold gas at a temperature lower than the droplet generator. In such embodiment, the cold gas introduced into the droplet generator absorbs heat from the droplet generator and becomes hot gas. Subsequently, the booster box is depressurized to exhaust the hot gas from the droplet generator. Then, temperature of the droplet generator is measured to whether a temperature of the droplet generator is within an acceptable cold temperature. When the temperature of the droplet generator is within the acceptable cold droplet generator temperature range, a droplet generator maintenance is performed. Then, the droplet generator is heated. Subsequently, the droplet generator is pressured.

In some embodiments, the cold gas is in a temperature range from 0° C. to 50° C. In some embodiments, the booster box of the coolant distribution unit is re-pressurized to introduce the gas into the droplet generator. In some embodiments, when the temperature of the droplet generator is not within the acceptable cold droplet generator temperature range, the droplet generator is depressurized and a heat exchanger of the heat exchange assembly is turned on. In some embodiments, after the turning on a heat exchanger of the heat exchange assembly, the booster box of the coolant distribution unit is pressurized to introduce the gas into the droplet generator. Then, the booster box is depressurized to exhaust the gas from the droplet generator, Subsequently, a temperature of the droplet generator is measured to determine whether the temperature of the droplet generator is within the acceptable temperature range. In some embodiments, when heating the droplet generator, a heating element inside the droplet generator is turned on. Then, a heat exchanger of the heat exchange assembly is turned on. Subsequently, the dual temperature three-way valve is switched to a system heated gas line of the air heating assembly. In some embodiments, the booster box of the coolant distribution unit is pressurized to introduce hot gas in a temperature range from 235° C. to 300° C. into the droplet generator. Then, the booster box is depressurized to exhaust gas from the droplet generator. Subsequently, a temperature of the droplet generator is measured to determine whether a temperature of the droplet generator is within an acceptable hot droplet generator temperature range from 235° C. to 300° C. In some embodiments, pressure at the droplet generator is monitored. Then, the pressure monitored is determined whether the pressure at the droplet generator is above a pressure threshold. When the pressure at the droplet generator is above the pressure threshold, an ambient temperature gas is introduced into the orifice of the droplet generator. In some embodiments, the gas is a forming gas. In some embodiments, the acceptable cold droplet generator temperature ranges from 5° C. to 50° C. In some embodiments, when the tin stored in the droplet generator is below the threshold level, clean dry air (CDA) is provided to the booster box of the coolant distribution unit to control the pressure of the droplet generator while depressurizing the droplet generator. In some embodiments, when the droplet generator maintenance is performed, the tin is refilled in the droplet generator or the droplet generator is replaced with a new droplet generator. In some embodiments, when the tin stored in the droplet generator is below the threshold level, a forced air flow is provided by an air conditioning device from a top to a bottom of the droplet generator to cool the droplet generator while depressurizing the droplet generator.

Another embodiment of the disclosure is a photolithographic apparatus that includes a droplet generator and a droplet generator maintenance system. The droplet generator maintenance system includes a coolant distribution unit, a gas supply unit, and a supporting member. The coolant distribution unit is configured to provide a pressurized gas from a booster box of the coolant distribution unit to an orifice of the droplet generator. The gas supply unit includes a heat exchange assembly and an air heating assembly. The supporting member includes a three-way valve and a dual temperature three-way valve. In some embodiments, the coolant distribution unit is configured to reduce the temperature of the droplet generator to within an acceptable range. In some embodiments, the coolant distribution unit is configured to provide clean dry air to the booster box of the coolant distribution unit to control the pressure to the droplet generator. In some embodiments, the heat exchange assembly is configured to extract heat from hot gas and to decrease the temperature of the gas prior to entering the booster box of the coolant distribution unit. In some embodiments, the air heating assembly is configured to provide heat to cold gas and to increase the temperature of the gas prior to entering the booster box of the coolant distribution unit.

According to another aspect of the present disclosure, a photolithographic apparatus includes a droplet generator; a droplet generator maintenance system; and a controller communicating with the droplet generator maintenance system. The droplet generator maintenance system operatively communicates with a droplet generator. The droplet generator maintenance system includes a coolant distribution unit, a gas supply unit, and a supporting member. The gas supply unit includes a heat exchange assembly and an air heating assembly. In some embodiments, the droplet generator maintenance system is further configured to monitor temperature measured by a temperature sensor of the droplet generator. In some embodiments, the droplet generator maintenance system is further configured to monitor pressure measured at the droplet generator, and determine whether to introduce an ambient temperature gas into an orifice of the droplet generator.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of servicing a droplet generator for a photolithographic apparatus, wherein the photolithographic apparatus comprises:
    a droplet generator maintenance system operatively communicating with a droplet generator and having a coolant distribution unit, a gas supply unit and a supporting member,
    wherein the coolant distribution unit provides a pressurized gas from a booster box of the coolant distribution unit to an orifice of the droplet generator,
    the gas supply unit includes a heat exchange assembly and an air heating assembly, and
    the supporting member includes a three-way valve and a dual temperature three-way valve,
    the method comprising:
        determining whether tin stored in the droplet generator is below a threshold level;
        when the tin stored in the droplet generator is below the threshold level, depressurizing the droplet generator;
        pressurizing the booster box of the coolant distribution unit to introduce a cold gas at a temperature lower than the droplet generator, wherein the cold gas introduced into the droplet generator absorbs heat from the droplet generator and becomes a hot gas;
        depressurizing the booster box to exhaust the hot gas from the droplet generator;
        determining whether a temperature of the droplet generator is within an acceptable cold droplet generator temperature;
        when the temperature of the droplet generator is within the acceptable cold droplet generator temperature range, performing a droplet generator maintenance;
        heating the droplet generator; and
        pressurizing the droplet generator.

2. The method of claim 1, wherein the cold gas is in a temperature range from 0° C. to 50° C.

3. The method of claim 1, wherein the determining whether the temperature of the droplet generator is within an acceptable cold droplet generator temperature range further comprises:
    when the temperature of the droplet generator is not within the acceptable cold droplet generator temperature range, depressurizing the droplet generator and turning on a heat exchanger of the heat exchange assembly.

4. The method of claim 3, further comprising:
    after the turning on the heat exchanger of the heat exchange assembly, pressurizing the booster box of the coolant distribution unit to introduce the cold gas into the droplet generator;
    depressurizing the booster box to exhaust the hot gas from the droplet generator; and
    determining whether the temperature of the droplet generator is within the acceptable cold droplet generator temperature range.

5. The method of claim 1, wherein the heating the droplet generator comprises:
    turning on a heating element inside the droplet generator;
    turning on a heat exchanger of the heat exchange assembly; and
    switching the dual temperature three-way valve to a system heated gas line of the air heating assembly.

6. The method of claim 5, after switching the dual temperature three-way valve further comprising:
    pressurizing the booster box of the coolant distribution unit to introduce a hot gas in a temperature range from 235° C. to 300° C. into the droplet generator;
    depressurizing the booster box to exhaust the hot gas from the droplet generator; and determining whether the temperature of the droplet generator is within an acceptable hot droplet generator temperature range of from 235° C. to 300° C.

7. The method of claim 6, further comprising:
monitoring pressure at the droplet generator;
determining whether the pressure at the droplet generator is above a pressure threshold; and
when the pressure at the droplet generator is above the pressure threshold, introducing an ambient temperature gas into the orifice of the droplet generator.

8. The method of claim 1, wherein the cold gas is a forming gas.

9. The method of claim 1, wherein the acceptable cold droplet generator temperature ranges from 5° C. to 50° C.

10. The method of claim 1, further comprising:
when the tin stored in the droplet generator is below the threshold level, providing clean dry air (CDA) to the booster box of the coolant distribution unit to control the pressure of the droplet generator while depressurizing the droplet generator.

11. The method of claim 1, wherein performing the droplet generator maintenance comprises refilling the tin in the droplet generator or replacing the droplet generator with a new droplet generator.

12. The method of claim 1, further comprising:
when the tin stored in the droplet generator is below the threshold level, providing a forced air flow by an air conditioning device from a top to a bottom of the droplet generator to cool the droplet generator while depressurizing the droplet generator.

13. A photolithographic apparatus, comprising:
a droplet generator; and
a droplet generator maintenance system, comprising:
  a coolant distribution unit configured to provide a pressurized gas from a booster box of the coolant distribution unit to an orifice of the droplet generator;
  a gas supply unit including a heat exchange assembly and an air heating assembly; and
  a supporting member including a three-way valve and a dual temperature three-way valve.

14. The photolithographic apparatus of claim 13, wherein the coolant distribution unit is configured to reduce a temperature of the droplet generator to within an acceptable cold droplet generator range.

15. The photolithographic apparatus of claim 13, wherein the coolant distribution unit is configured to provide clean dry air to the booster box of the coolant distribution unit to control pressure to the droplet generator.

16. The photolithographic apparatus of claim 13, wherein the heat exchange assembly is configured to extract heat from a hot gas and to decrease a temperature of the hot gas prior to entering the booster box of the coolant distribution unit.

17. The photolithographic apparatus of claim 13, wherein the air heating assembly is configured to provide heat to a cold gas and to increase a temperature of the cold gas prior to entering the booster box of the coolant distribution unit.

18. A photolithographic apparatus, comprising:
a droplet generator;
a droplet generator maintenance system; and
a controller communicating with the droplet generator maintenance system,
wherein the droplet generator maintenance system operatively communicates with the droplet generator, and comprises:
  a coolant distribution unit to provide a pressurized gas to the droplet generator; and
  a gas supply unit including a heat exchanger and an air heating assembly, and
the droplet generator maintenance system is configured such that a heat exchanged gas that passes through the heat exchanger is provided to the coolant distribution unit and is pressurized at the coolant distribution unit.

19. The photolithographic apparatus of claim 18, wherein the droplet generator maintenance system is further configured to monitor temperature measured by a temperature sensor of the droplet generator.

20. The photolithographic apparatus of claim 18, wherein the droplet generator maintenance system is further configured to monitor pressure measured at the droplet generator, and determine whether to introduce an ambient temperature gas into an orifice of the droplet generator.

* * * * *